US012191276B2

(12) United States Patent
Dzhangirov et al.

(10) Patent No.: US 12,191,276 B2
(45) Date of Patent: Jan. 7, 2025

(54) MOUNTING APPARATUS

(71) Applicant: SHINKAWA LTD., Tokyo (JP)

(72) Inventors: Alexander Dzhangirov, Tokyo (JP); Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 172 days.

(21) Appl. No.: 17/642,948

(22) PCT Filed: Jul. 16, 2020

(86) PCT No.: PCT/JP2020/027600
§ 371 (c)(1),
(2) Date: Mar. 14, 2022

(87) PCT Pub. No.: WO2022/013995
PCT Pub. Date: Jan. 20, 2022

(65) Prior Publication Data
US 2022/0415845 A1 Dec. 29, 2022

(51) Int. Cl.
*B32B 41/00* (2006.01)
*H01L 23/00* (2006.01)

(52) U.S. Cl.
CPC .... *H01L 24/75* (2013.01); *H01L 2224/75301* (2013.01); *H01L 2224/75611* (2013.01); *H01L 2224/75824* (2013.01)

(58) Field of Classification Search
CPC ........... H01L 24/75; H01L 2224/75301; H01L 2224/75611; H01L 2224/75824; H01L 24/81; H01L 2224/75252; H01L 2224/75502; H01L 2224/75; H01L 2224/75317; H01L 2224/75745;
(Continued)

(56) References Cited

U.S. PATENT DOCUMENTS

2011/0020983 A1  1/2011  Tomura et al.
2021/0175201 A1  6/2021  Seyama et al.

FOREIGN PATENT DOCUMENTS

CN     111344848    6/2020
JP     2004165536   6/2004
(Continued)

OTHER PUBLICATIONS

"International Search Report (Form PCT/ISA/210) of PCT/JP2020/027600," mailed on Oct. 6, 2020, pp. 1-3.
(Continued)

*Primary Examiner* — Michael N Orlando
*Assistant Examiner* — Joshel Rivera
(74) *Attorney, Agent, or Firm* — JCIPRNET (57) ABSTRACT

The present invention provides a mounting apparatus, including a bonding stage holding a substrate on which a semiconductor chip is arranged; a base stand; a mounting head mounted with a pressing tool that presses the semiconductor chip on the substrate; and a film arranging mechanism provided on the base stand and moving a cover film along the bonding stage to arrange the cover film between the semiconductor chip pressed by the substrate and the pressing tool. The film arranging mechanism includes film guides guiding the cover film and defining a height with respect to the bonding stage; and lifting mechanisms connected to the film guides via springs and lifting and lowering the film guides with respect to the bonding stage.

15 Claims, 7 Drawing Sheets

(58) Field of Classification Search
CPC ..... H01L 2224/758; H01L 2224/81191; H01L 2224/83192; H01L 2224/83862; H01L 21/50; H01L 21/67; H01L 21/67121; H01L 21/563; H01L 21/68742; H01L 21/67144; H01L 21/67132
USPC .................... 156/60, 64, 350, 351, 378, 379
See application file for complete search history.

(56) References Cited

FOREIGN PATENT DOCUMENTS

| | | | | |
|---|---|---|---|---|
| JP | 2007012641 | | 1/2007 | |
| JP | 2009016544 | | 1/2009 | |
| KR | 20120119679 A | * | 10/2012 | ............. H01L 21/68 |
| KR | 101297680 | | 8/2013 | |
| WO | 2009128206 | | 10/2009 | |
| WO | 2019107395 | | 6/2019 | |

OTHER PUBLICATIONS

"Office Action of China Counterpart Application", with partial English translation thereof, issued Oct. 15, 2024, pp. 1-12.

* cited by examiner

MOUNTING APPARATUS

CROSS-REFERENCE TO RELATED APPLICATION

This application is a 371 application of the International PCT application serial no. PCT/JP2020/027600, filed on Jul. 16, 2020. The entirety of each of the above-mentioned patent applications is hereby incorporated by reference herein and made a part of this specification.

BACKGROUND

Technical Field

The present invention relates to a structure of a mounting apparatus that mounts a semiconductor chip on a mounted body such as a substrate or other semiconductor chips via an adhesive material.

Related Art

Conventionally, there has been known a technique of flip chip bonder for mounting a semiconductor chip on a mounted body such as a substrate or other semiconductor chips without using wires. In the flip chip bonder, an adhesive material made of thermosetting resin is applied to the mounted body in advance, the semiconductor chip is heated and pressed by a pressing tool to melt the solder on electrodes and on the mounted body, and then the pressing tool is cooled to solidify the solder to join the semiconductor chip to the substrate. In this case, when the semiconductor chip is heated and pressurized by the pressing tool, the adhesive material extruded by the semiconductor chip may crawl upward and adhere to the mounting head.

In order to prevent the adhesive material from adhering to the pressing tool, a mounting apparatus in which the bottom surface of the pressing tool is covered with a film member (cover film) is disclosed. For example, Patent Literature 1 proposes an apparatus in which, after a work configured by a substrate and a semiconductor chip is placed on a bonding stage, a resin film is moved in the horizontal direction to interpose a resin film between the work and the joining tool, and then a semiconductor chip is pressed with a joining tool from above a resin film, bumps and electrodes are joined by heating and ultrasonic vibration, and the semiconductor chip is fixed on a substrate with an adhesive.

CITATION LIST

Patent Literature

[Patent Literature 1] Japanese Unexamined Patent Publication No. 2004-165536

SUMMARY

Problems to be Solved

By the way, in a case where the semiconductor chip is pressed and heated with the joining tool from above the resin film with the cover film interposed between the pressing tool and the semiconductor chip as in the apparatus described in Patent Literature 1, if the bonding stage, which suctions and fixes the work, and the cover film are not arranged in parallel, when the semiconductor chip is pressed and heated by the joining tool, the adhesive material extruded by the semiconductor chip will crawl up unevenly, or static electricity may be generated during mounting. Therefore, in such an apparatus, parallelism between the bonding stage and the cover film is required.

On the other hand, since the bonding stage is heated by a heater, the parallelism between the bonding stage and the cover film cannot be maintained due to the thermal expansion of the bonding stage.

Therefore, an object of the present invention is to ensure the parallelism between a bonding stage and a cover film in a mounting apparatus in which the cover film is interposed between the pressing tool and the semiconductor chip to press the semiconductor chip on a mounted body.

Means for Solving Problems

The mounting apparatus of the present invention is a mounting apparatus pressing a semiconductor chip arranged on a mounted body, the mounting apparatus including: a bonding stage, holding the mounted body on which the semiconductor chip is arranged; a base stand, supporting the bonding stage; a mounting head, moving in a contacting/separating direction with respect to the mounted body and to which a pressing tool that presses the semiconductor chip on the mounted body is mounted on the tip; and a film arranging mechanism, provided on the base stand and moving a cover film along the bonding stage to arrange the cover film between the semiconductor chip and the pressing tool. The film arranging mechanism includes: film guides guiding the cover film, the film guide including a contact portion that contacts the bonding stage and defining a height of the cover film with respect to the bonding stage; and lifting mechanisms, connected to the film guides via elastic members and lifting and lowering the film guides with respect to the bonding stage.

In this way, the height of the film guide can be adjusted by the lifting mechanism to ensure the parallelism between the bonding stage and the cover film.

In the mounting apparatus of the present invention, the film guides and the lifting mechanisms may be each provided at two sides of the bonding stage with the bonding stage sandwiched in between.

In this way, since the height of the cover film with respect to the bonding stage is adjusted at two sides of the bonding stage, the parallelism between the bonding stage and the cover film can be ensured.

In the mounting apparatus of the present invention, the film arranging mechanism may include a linking member linking between the film guides each provided at two sides of the bonding stage with the bonding stage sandwiched in between.

As a result, the height difference of the film guides at two sides can be eliminated, and the parallelism between the bonding stage and the cover film can be ensured.

In the mounting apparatus of the present invention, the lifting mechanism includes: a guide rail, provided on the base stand and extending in an up-and-down direction; a slider, guided by the guide rail and moving in the up-and-down direction; and a connecting member in which one end thereof is mounted on the slider via the elastic members so as to be relatively movable in the up-and-down direction by a predetermined vertical width and the film guide is mounted on another end thereof. The slider, when the contact portion of the film guide comes into contact with an upper surface of the bonding stage, presses the film guide on an upper surface of the bonding stage via the elastic members and the connecting member.

In this way, since the film guide is pressed onto the bonding stage by the urging force of the elastic members, the height of the film guide with respect to the surface of the bonding stage can be made constant, and the parallelism between the bonding stage and the cover film can be ensured.

In the mounting apparatus of the present invention, the film arranging mechanism includes: a film delivering mechanism, including a pair of rollers which are provided on the base stand at two sides of the bonding stage with the bonding stage sandwiched in between and on which the cover film is hung, and sequentially delivering the new cover film. The film delivering mechanism includes a base supporting each of the rollers, and each guide rail of the lifting mechanism is mounted on each base.

In this way, since the lifting mechanism is mounted on the base of the film delivering mechanism, the lifting mechanism and the film guide can move, together with the film delivering mechanism, in the horizontal direction with respect to the bonding stage.

In the mounting apparatus of the present invention, the film arranging mechanism includes: a one-side film guide and a one-side lifting mechanism, provided at one side of the bonding stage; and an another-side film guide and an another-side lifting mechanism, provided at another side of the bonding stage. The one-side lifting mechanism includes: a one-side guide rail, provided on the base stand at one side and extending in an up-and-down direction; a slider, guided by the one-side guide rail and moving in the up-and-down direction; and a connecting member in which one end thereof is mounted on the slider via the elastic members so as to be relatively movable in the up-and-down direction by a predetermined vertical width and the one-side film guide is mounted on another end thereof. The another-side lifting mechanism includes: an another-side guide rail, provided on the base stand at another side and extending in the up-and-down direction to guide the another-side film guide in the up-and-down direction. The film arranging mechanism includes a linking member linking the one-side film guide and the another-side film guide, and the slider, when the contact portion of the one-side film guide and the contact portion of the another-side film guide come into contact with an upper surface of the bonding stage, presses the contact portion of the one-side film guide on an upper surface of the bonding stage via the elastic members and the connecting member and presses the contact portion of the another-side film guide on a top of the bonding stage via the linking member.

In this way, since the one-side film guide and the another-side film guide are lifted and lowered in the up-and-down direction by the slider arranged at one side, the parallelism between the bonding stage and the cover film can be ensured with a simple configuration.

In the mounting apparatus of the present invention, the film arranging mechanism includes: a film delivering mechanism, including a pair of rollers which are provided on the base stand at two sides of the bonding stage with the bonding stage sandwiched in between and on which the cover film is hung, and sequentially delivering the new cover film. The film delivering mechanism includes a base supporting each of the rollers, and the one-side guide rail is mounted on the base at one side, and the another-side guide rail is mounted on the base at another side.

In this way, since the lifting mechanism is mounted on the base of the film delivering mechanism, the lifting mechanism and the film guide can move, together with the film delivering mechanism, in the horizontal direction with respect to the bonding stage.

In the mounting apparatus of the present invention, the connecting member is a groove-shaped cross-sectional member configured by an upper flange, a lower flange facing the upper flange, and a web connecting between the upper flange and the lower flange, the connecting member including: a slider-guide, extending in the up-and-down direction between the upper flange and the lower flange. The slider is guided by the slider-guide so as to be movable with respect to the connecting member in the up-and-down direction between the upper flange and the lower flange, and the elastic members are provided between a lower end of the slider and an upper surface of the lower flange.

As a result, with a simple configuration, when the slider is lifted, the film guide is lifted together with the slider, and when the slider is lowered and the film guide is in contact with the bonding stage, the film guide can be pressed onto the bonding stage by the urging force of the elastic members.

In the mounting apparatus of the present invention, the film arranging mechanism may include moving mechanisms moving the film delivering mechanism in a horizontal direction with respect to the bonding stage.

As a result, the film delivering mechanism, the lifting mechanism, and the film guide can be integrally moved in the horizontal direction with respect to the bonding stage.

Effects of Invention

In a mounting apparatus in which a cover film is interposed between the pressing tool and the semiconductor chip to press the semiconductor chip on the mounted body, the parallelism between the bonding stage and the cover film can be ensured.

DESCRIPTION OF THE EMBODIMENTS

Hereinafter, a mounting apparatus 10 of the embodiment will be described with reference to the drawings. The mounting apparatus 10 is an apparatus that manufactures a semiconductor apparatus by mounting a plurality of semiconductor chips 100 on a substrate 104 as a mounted body.

Figure 1:
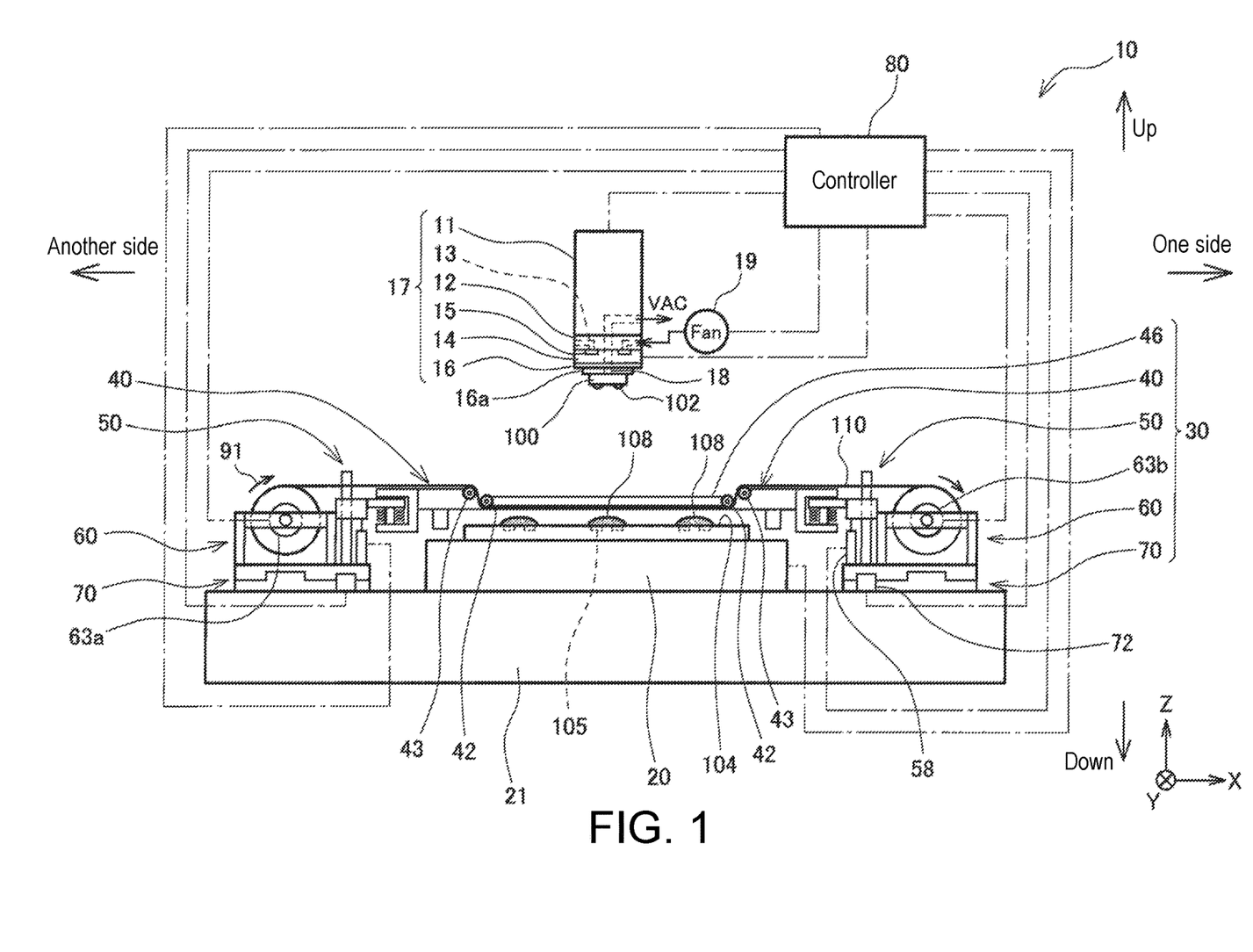
FIG. 1 is a schematic elevational view showing a configuration of a mounting apparatus according to an embodiment.
Figure 2:
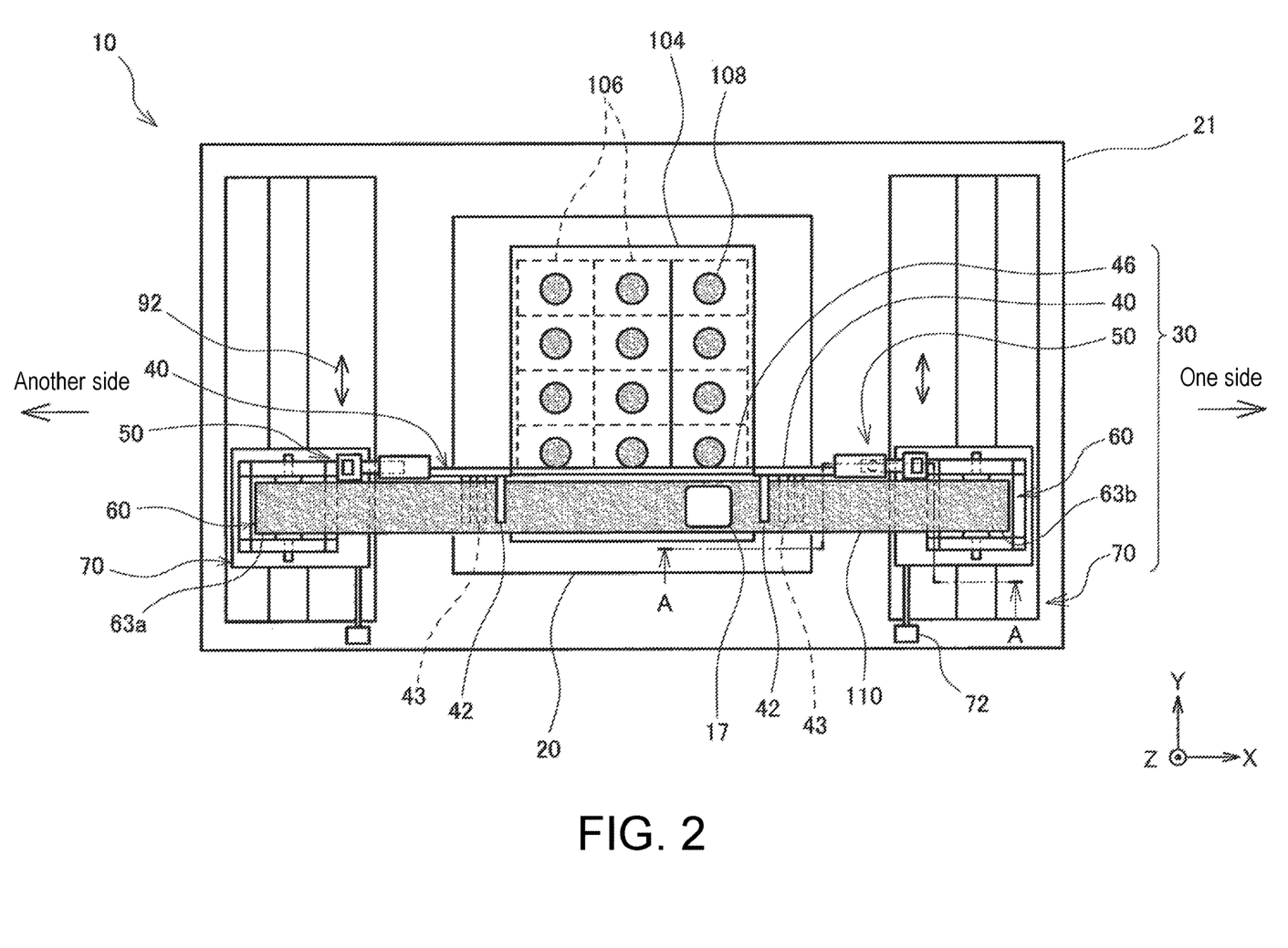
FIG. 2 is a schematic plan view showing a configuration of the mounting apparatus according to an embodiment.

As shown in FIG. 1 and FIG. 2, the mounting apparatus 10 includes a bonding stage 20, a base stand 21, a mounting head 17, a film arranging mechanism 30, and a control unit 80 that controls the movement of each of these portions. In the following description, the extending direction of a cover film 110 will be described as X direction, the direction perpendicular to the X direction on the horizontal plane will be Y direction, and the up-and-down direction will be Z direction. Further, the side provided with a winding roller 63b, which will be described later, will be referred to as one side, and the side provided with a delivery roller 63a will be referred to as another side.

The bonding stage 20 is a stage that holds the substrate 104 on the upper surface. The bonding stage 20 is provided with, for example, a suction hole (not shown) that suctions and holds the substrate 104, a heater (not shown) that heats the substrate 104, and the like. The bonding stage 20 is supported by the base stand 21.

The mounting head 17 is provided so as to face the bonding stage 20, and is configured by a main body 11, a heat insulating block 12 mounted on the lower side of the main body 11, a heater 14 mounted on the lower side of the heat insulating block 12, and a pressing tool 16 mounted on the lower side of the heater 14.

The main body 11 may be moved in the up-and-down direction, which is a contacting/separating direction with respect to the substrate 104 suctioned on the bonding stage 20 by a drive mechanism provided inside, and may also be moved in the horizontal direction with respect to the substrate 104.

The heat insulating block 12 is a ceramic plate-shaped member sandwiched between the main body 11 and the heater 14 to prevent the heat of the heater 14 from being transferred to the main body 11. The heater 14 is formed by embedding a heat generating resistor made of platinum, tungsten, or the like inside a ceramic such as aluminum nitride.

Two cooling grooves 15 extending in the direction perpendicular to the paper surface of FIG. 1 are provided on the upper surface of the heater 14. Further, the heat insulating block 12 is provided with an air flow path 13 extending in an L shape from the side surface and communicating the side surface and the cooling grooves 15 provided in the heater 14. When electric power is input from the control unit 80, the heater 14 generates heat and the temperature rises, heating the pressing tool 16 mounted on the lower side of the heater 14. Further, when the air from the fan 19 flow through the air flow path 13 of the heat insulating block 12, the heater 14 is cooled, whereby the pressing tool 16 is cooled.

The pressing tool 16 has a top surface having substantially the same size as the heater 14, and is provided with a projecting portion 16a on the lower side that suctions and presses a semiconductor chip 100. The size of the projecting portion 16a is substantially the same as the size of the semiconductor chip 100. The pressing tool 16 is made of ceramics. A suction hole 18 for suctioning and holding the semiconductor chip 100 is formed in the pressing tool 16. The suction hole 18 penetrates the heater 14 and the heat insulating block 12 and communicates with a suction pump (not shown) from the main body 11, and the semiconductor chip 100 is suctioned and held on the lower surface of the projecting portion 16a of the pressing tool 16 by the negative pressure generated by the suction pump.

The base stand 21 of the mounting apparatus 10 is provided with the film arranging mechanism 30 that interposes the cover film 110 between the semiconductor chip 100 and the pressing tool 16 when mounting the semiconductor chip 100. As the material of the cover film 110, a material having excellent heat resistance and high peelability of an adhesive material 108 is suitable. Therefore, as the material of the cover film 110, for example, a fluororesin such as polytetrafluoroethylene (PTFE) or tetrafluoroethylene-perfluoroalkyl vinyl ether copolymer (PFA) may be used.

The film arranging mechanism 30 includes film guides 40, a linking member 46, lifting mechanisms 50, a film delivering mechanism 60, and moving mechanisms 70.

The film delivering mechanism 60 sequentially delivers the strip-shaped cover film 110 above the substrate 104. It has the delivery roller 63a provided at another side of the bonding stage 20 and the winding roller 63b provided at one side (hereinafter, when the delivery roller 63a and the winding roller 63b are not distinguished, they are simply referred to as "feed-roller 63"). The cover film 110 is hung between the pair of feed-rollers 63. When the delivery roller 63a rotates in a predetermined delivering direction (direction of arrow 91 in FIG. 1), new cover film 110 is sequentially delivered. Further, in conjunction with the delivery roller 63a, the winding roller 63b rotates in the same direction as the delivery roller 63a, so that used cover film 110 is wound up onto the winding roller 63b and collected. The delivery roller 63a and the winding roller 63b are each driven by a drive motor (not shown). The delivery roller 63a may be a driven roller that is not driven by a motor and is driven by the rotation of the winding roller 63b.

The delivery roller 63a and of the winding roller 63b have the supporting structure 65; the only difference is that the two are symmetrical with the bonding stage 20 sandwiched in between. Further, the lifting mechanisms 50, the film guides 40, and the moving mechanisms 70 are each provided at one side and another side of the bonding stage 20, and the only difference that the two are symmetrical with the bonding stage 20 sandwiched in between. Therefore, the supporting structure 65 of the winding roller 63b, the lifting mechanism 50, the film guide 40, and the moving mechanism 70 that are arranged at one side of the bonding stage 20 will be described below.

Figure 3:
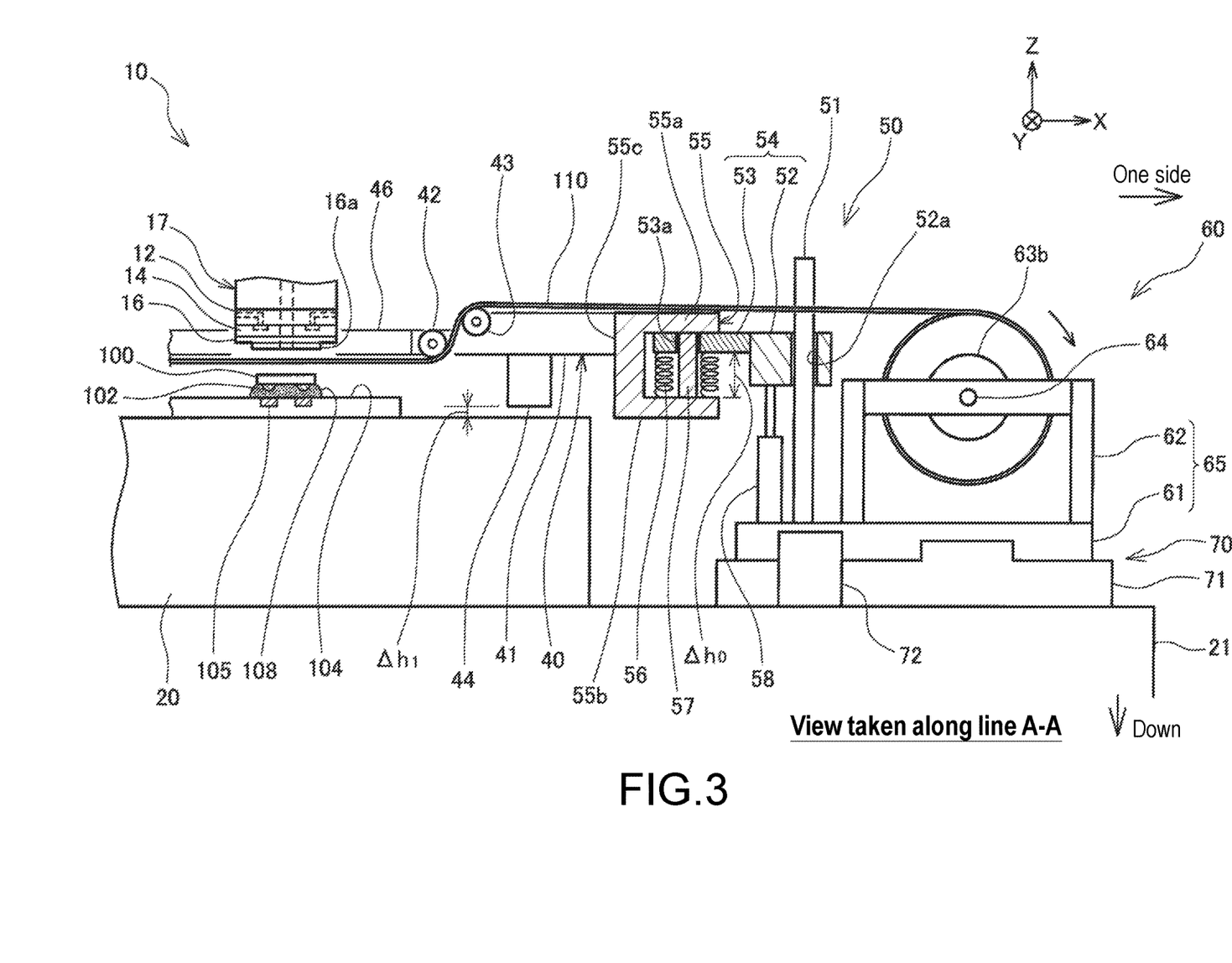
FIG. 3 is an elevational view showing the configuration of one side of the mounting apparatus according to the embodiment, and is a view taken along line AA shown in FIG. 2.
Figure 4:
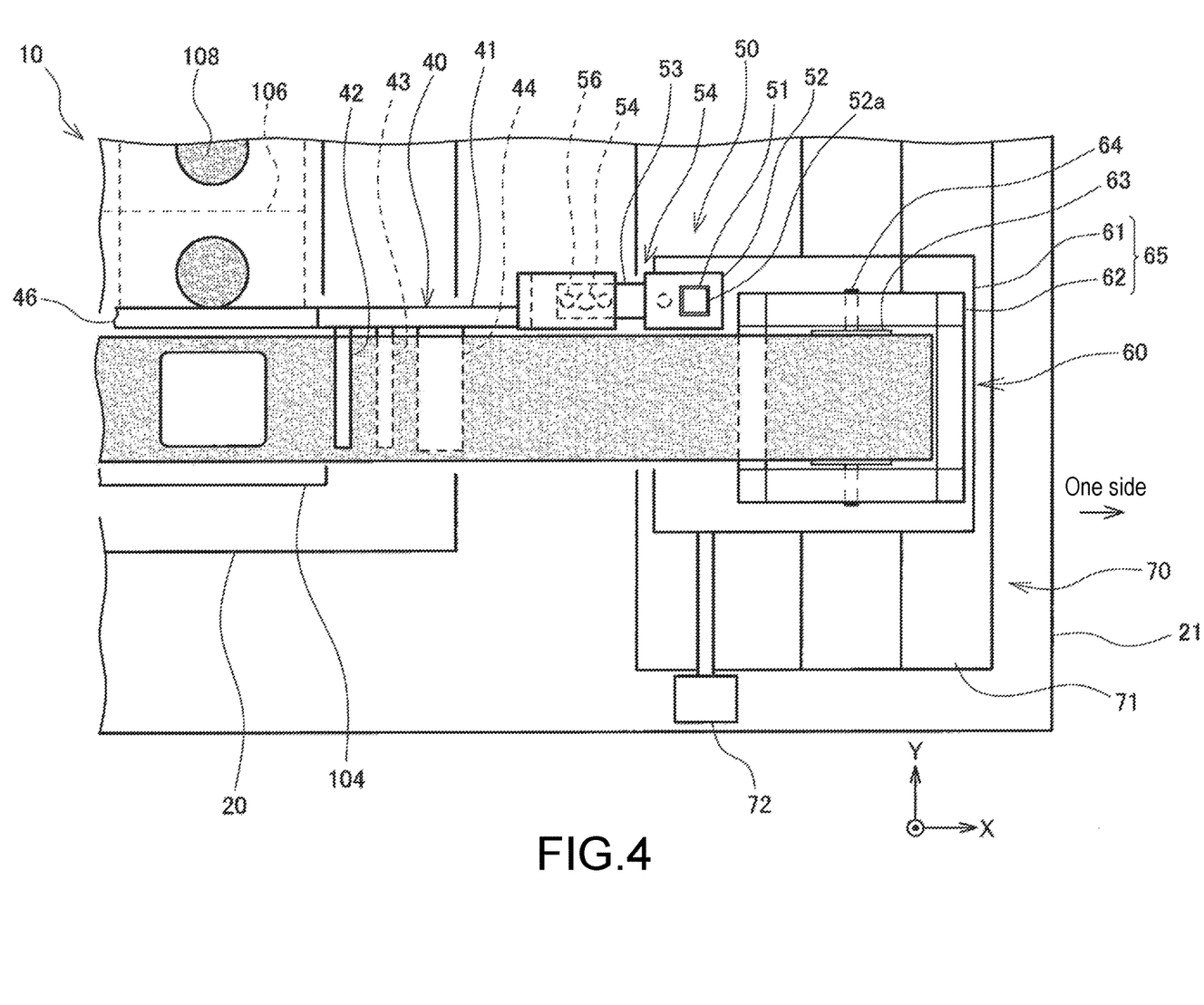
FIG. 4 is a plan view showing the configuration of one side of the mounting apparatus of the embodiment.

As shown in FIG. 3 and FIG. 4, the supporting structure 65 of the winding roller 63b is configured by a base 61 and a frame 62. The base 61 is mounted on a rail 71, provided on the upper surface of the base stand 21 at one side of the bonding stage 20 and extending in the Y direction, so as to be movable in the Y direction. The frame 62 is configured by four pillars mounted on the base 61 and four beams connecting the upper portions of the pillars. A shaft 64 of the winding roller 63b is rotatably mounted on the two opposing beams extending in the X direction.

The lifting mechanism 50 is mounted on the base 61 that supports the winding roller 63b of the film delivering mechanism 60, and the film guide 40 is connected to the lifting mechanism 50. The film guide 40 defines the height of the cover film 110 with respect to the bonding stage 20, and the lifting mechanism 50 lifts and lowers the film guide 40 with respect to the bonding stage 20.

The lifting mechanism 50 is configured by a guide rail 51, a slider 54, a connecting member 55, springs 56, and a Z-direction actuator 58. The springs 56 are an example of elastic members, but the present invention is not limited thereto. Elastic members such as plate panels, rubbers, or sponges may be used.

The guide rail 51 is mounted on the upper surface of the base 61 of the film delivering mechanism 60 so as to extend in the up-and-down direction. The slider 54 is configured by a main body portion 52 and an arm portion 53. A hole 52a provided in the center of the main body portion 52 fits into the guide rail 51 and may move in the up-and-down direction along the guide rail 51. Further, the tip of the Z-direction actuator 58 mounted on the base 61 is connected to the lower end of the main body portion 52, and the main body portion 52 is driven in the up-and-down direction by the Z-direction actuator 58. The arm portion 53 has one end connected to the main body portion 52, and a hole 53a provided at another end fitted into a slider-guide 57 of the connecting member 55 to be described later, and is movably connected to the slider-guide 57 in the up-and-down direction.

The connecting member 55 is a groove-shaped cross-section member configured by a plate-shaped upper flange 55a, a plate-shaped lower flange 55b facing the upper flange 55a, and a plate-shaped web 55c that connects the upper flange 55a and the lower flange 55b in the up-and-down direction. The slider-guide 57 extending in the up-and-down direction is provided between the upper flange 55a and the lower flange 55b. With the hole 53a fitted into the slider-guide 57, the arm portion 53 of the slider 54 is guided by the slider-guide 57 and is connected between the upper flange 55a and the lower flange 55b so as to be relatively movable in the up-and-down direction with respect to the connecting member 55.

In other words, the arm portion 53 of the slider 54 is mounted so as to be relatively movable in the up-and-down direction with respect to the connecting member 55 by a predetermined vertical width between the lower surface of the upper flange 55a and the upper surface of the lower flange 55b of the connecting member 55. That is, the connecting member 55 is mounted so as to be relatively movable in the up-and-down direction with respect to the arm portion 53 of the slider 54 by a predetermined vertical width between the lower surface of the upper flange 55a and the upper surface of the lower flange 55b.

The springs 56 are mounted between the upper surface of the lower flange 55b of the connecting member 55 and the lower surface of the arm portion 53 of the slider 54. The springs 56 urge the arm portion 53 upward so that the upper surface of the arm portion 53 of the slider 54 is in contact with the lower surface of the upper flange 55a.

The film guide 40 is connected to the surface of the connecting member 55 at the web 55c side of the bonding stage 20. The film guide 40 is configured by a base body portion 41, a lower guide roller 42, an upper guide roller 43, and a stopper 44.

The base body portion 41 is a longitudinal member connected to the web 55c and extending toward the bonding stage 20 along the side edge of the cover film 110 on the upper surface of the bonding stage 20. The lower guide roller 42 is a columnar rotating body mounted on the side surface of the tip portion of the base body portion 41 at the bonding stage 20 side and extends from the base body portion 41 toward the cover film 110 in a direction perpendicular to the extending direction of the cover film 110, and around which the cover film 110 is wrapped on the lower side. The upper guide roller 43 is arranged at one side of the lower guide roller 42. The upper guide roller 43 is a columnar rotating body mounted on the side surface of the base body portion 41 and extends from the base body portion 41 toward the cover film 110 in a direction perpendicular to the extending direction of the cover film 110, and around which the cover film 110 is wrapped on the upper side.

The stopper 44 is a plate-shaped member mounted on the lower end surface of the base body portion 41 and extends from the base body portion 41 toward the minus side in the Y direction. The stopper 44 is arranged at a position where the lower end abuts on the upper surface of one side of the bonding stage 20, and constitutes a contact portion that contacts the upper surface of the bonding stage 20. The height of the stopper 44 is a height at which when the lower end of the stopper 44 abuts on the upper surface of the bonding stage 20, the height of the lower surface of the cover film 110 becomes a height in contact with the upper surface of the semiconductor chip 100 temporarily crimped onto the substrate 104.

The tip of the base body portion 41 of the film guide 40 at one side and the tip of the base body portion 41 of the film guide 40 at another side are connected by the linking member 46. The linking member 46 is a longitudinal member extending in the X direction along the side end of the cover film 110 on the upper surface of the bonding stage 20. The film guide 40 at another side has the same structure as the film guide 40 at one side except for having a symmetrical shape with respect to the bonding stage 20.

As shown in FIG. 1 and FIG. 2, the cover film 110 wrapped around the upper guide roller 43 of the film guide 40 at one side extends toward the winding roller 63b arranged at one side and is wound by the winding roller 63b. Further, the cover film 110 wrapped around the lower guide roller 42 of the film guide 40 at one side extends to another side to be wrapped around the lower side of the lower guide roller 42 of the film guide 40 arranged at another side, and is then wrapped around the upper side of the upper guide roller 43 of the film guide 40 arranged at another side and extends toward the delivery roller 63a.

In this way, the cover film 110 hung between the delivery roller 63a at another side and the winding roller 63b at one side is wrapped around the lower guide roller 42 and the upper guide roller 43 of the two film guides 40 arranged at two sides of the bonding stage 20, respectively. The height of the cover film 110 from the bonding stage 20 is defined by lower guide rollers 42 at two sides.

Returning to FIG. 3, the moving mechanism 70 is configured by the rail 71 provided on the upper surface of the base stand 21 at one side of the bonding stage 20; and a Y-direction actuator 72, provided above the base stand 21, that drives the base 61 of the film delivering mechanism 60, guided by the rail 71, in the Y direction. Since the Y-direction actuator 72 moves the base 61, to which the winding roller 63b of the film delivering mechanism 60 and the lifting mechanism 50 are connected, in the Y direction (direction of arrow 92 in FIG. 2), the winding roller 63b of the film delivering mechanism 60, the lifting mechanism 50, and the film guide 40 connected to the lifting mechanism 50 are integrally moved in the Y direction.

The supporting structure 65 of the winding roller 63b, the lifting mechanism 50, the film guide 40, and the moving mechanism 70 that are arranged at one side of the bonding stage 20 have been described above. The supporting structure 65 of the delivery roller 63a, the lifting mechanism 50, the film guide 40, and the moving mechanism 70 that are arranged at another side of the bonding stage 20 have the same structure as those at one side except for having a symmetrical shape with respect to the bonding stage 20, therefore the description thereof will be omitted.

The control unit 80 is connected to a main body 11 of the mounting head 17, the heater 14, a fan 19, the Z-direction actuator 58 of the lifting mechanism 50, the drive motor (not shown) of the film delivering mechanism 60, the Y-direction actuator 72 of the moving mechanism 70, and the bonding stage 20, and controls the movement of the mounting head 17, the movement of the slider 54 of the lifting mechanism 50 in the Z direction, the rotation of the feed-rollers 63, and the movement of the base 61 in the Y direction, and controls the temperature of the pressing tool 16 by the heater 14 and the fan 19. The control unit 80 includes, for example, a CPU that performs various operations and a memory that stores various data and programs. The detection results of various sensors are input to the control unit 80, and the control unit 80 performs driving control and temperature control of each portion according to the detection results.

Next, the operation of the mounting apparatus 10 of the embodiment will be described with reference to FIG. 3 to FIG. 6. The mounting apparatus 10 mounts the semiconductor chip 100 on the substrate 104 by the technique of flip chip bonder. Specifically, as shown in FIG. 1, the mounting apparatus 10 electrically connects the semiconductor chip 100 to the substrate 104 by joining the protrusions, made of conductive material and referred to as bumps 102 formed on the bottom surface of the semiconductor chip 100, to electrodes 105 formed on the surface of the substrate 104.

As shown in FIG. 2 and FIG. 3, on the substrate 104, a plurality of electrodes 105 electrically connected to the bumps 102 of the semiconductor chip 100 are formed and mounting section 106 where the semiconductors 100 are mounted are defined. Each of the mounting sections 106 is pre-coated with the adhesive material 108, which is an insulating thermosetting resin.

The control unit 80 of the mounting apparatus 10 makes the semiconductor chip 100 suctioned and held on the pressing tool 16 at the tip of the mounting head 17, lowers the mounting head 17 and presses it on the adhesive material 108 of the mounting section 106 to temporarily crimp the semiconductor chip 100 onto the adhesive material 108. At the time of temporary crimping, the cover film 110 is retracted to a position horizontally separated from the mounting section 106 by the moving mechanism 70.

After the temporary crimping, the control unit 80 drives the moving mechanism 70 to move the cover film 110 in the horizontal direction, and as shown in FIG. 3, moves the cover film 110 to a position directly above the temporarily crimped semiconductor chip 100 and between the semiconductor chip 100 and the pressing tool 16. At this time, the height of the cover film 110 is defined by the lower guide roller 42 of the film guide 40. The height of the cover film 110 is midway between the upper surface of the semiconductor chip 100 and the pressing tool 16.

At this time, as shown in FIG. 3, there is a gap having a height of Ah1 between the lower end of the stopper 44 of the film guide 40 and the upper surface of the bonding stage 20. Further, the arm portion 53 of the slider 54 of the lifting mechanism 50 is urged by the springs 56 and is in contact with the lower surface of the upper flange 55a of the connecting member 55, and there is a gap having a height of Ah0 between the lower surface of the arm portion 53 and the lower flange 55b of the connecting member 55. The length of the springs 56 is Ah0.

Figure 5:
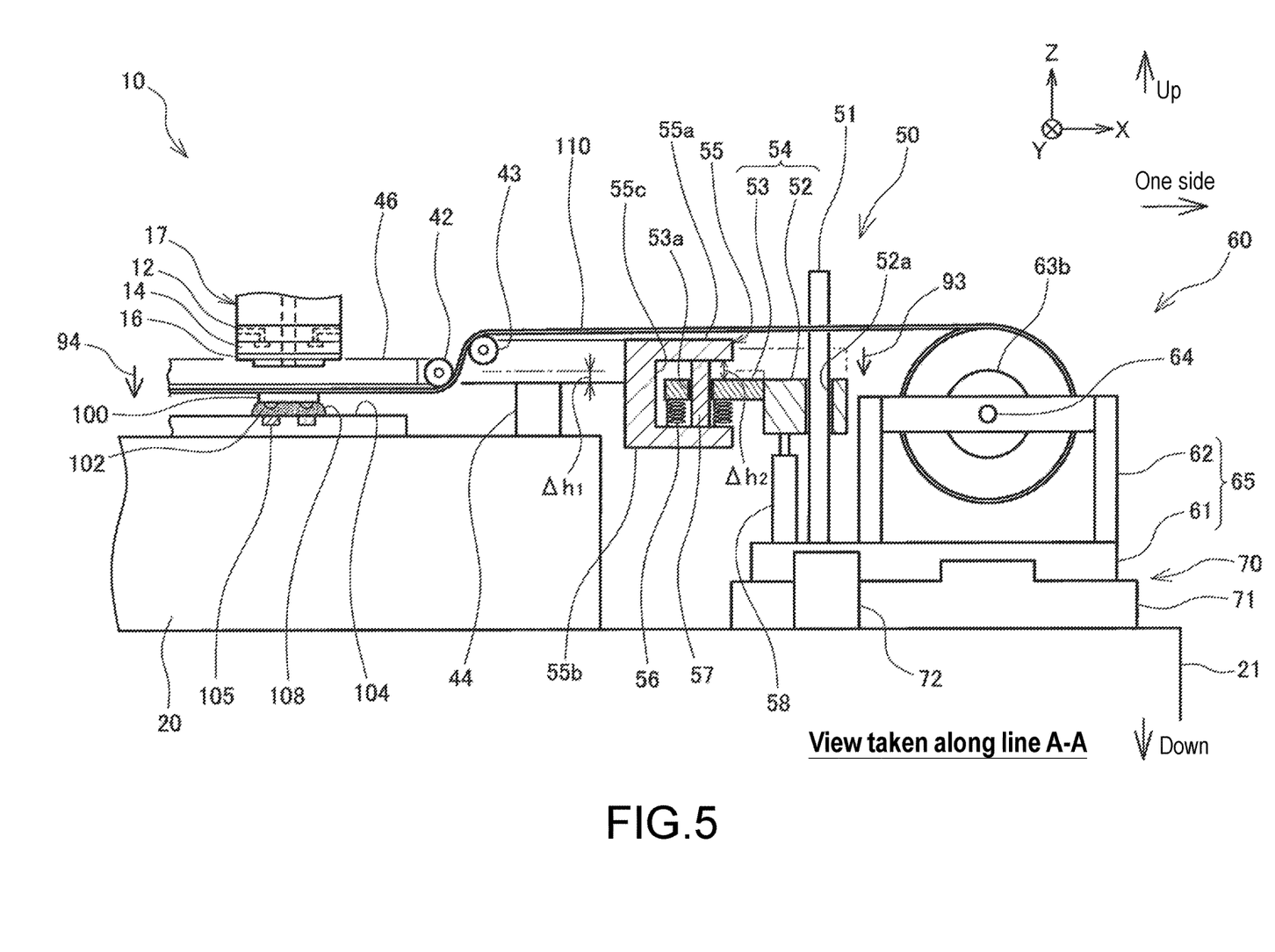
FIG. 5 is an elevational view showing a state in which a film guide is lowered by a lifting mechanism of the mounting apparatus according to the embodiment to abut the upper surface of the bonding stage, and is a view taken along line AA shown in FIG. 2.

As shown in FIG. 5, the control unit 80 operates the Z-direction actuator 58 of the lifting mechanism 50 to lower the main body portion 52 of the slider 54 as shown by an arrow 93. Then, the arm portion 53 and the film guide 40 also descend as shown by an arrow 94 in FIG. 5. When the slider 54 is lowered by the height Ah1 from the state shown in FIG. 3, the lower end of the stopper 44 of the film guide 40 abuts the bonding stage 20 as shown in FIG. 5. At this time, the lower surface of the cover film 110 is at a height in contact with the upper surface of the temporarily crimped semiconductor chip 100.

After that, the control unit 80 further lowers the slider 54 by a height Ah2 by the Z-direction actuator 58. As a result, the springs 56 are compressed by the height Ah2, and a gap having the height Ah2 is formed between the upper surface of the arm portion 53 of the slider 54 and the lower surface of the upper flange 55a of the connecting member 55. Then, the stopper 44 of the film guide 40 is pressed onto the bonding stage 20 by the reaction force due to the compression of the springs 56. The pressing force keeps the height of the film guide 40 with respect to the bonding stage 20 constant.

The control unit 80 operates the Z-direction actuator 58 of the lifting mechanism 50 arranged at another side in the same manner as the Z-direction actuator 58 of the lifting mechanism 50 arranged at one side, and presses the stopper 44 of the film guide 40 at another side on the upper surface of the bonding stage 20. As a result, the height of the film guide 40 at another side with respect to the bonding stage 20 becomes the same as the height of the film guide 40 at one side with respect to the bonding stage 20. Thereby, the parallelism between the cover film 110 and the bonding stage 20 can be ensured. Accordingly, as shown in FIG. 2, even when the cover film 110 covers the upper surfaces of the plurality of semiconductor chips 100 in the longitudinal direction, it can be brought into close contact with the upper surface of each of the semiconductor chips 100.

Figure 6:
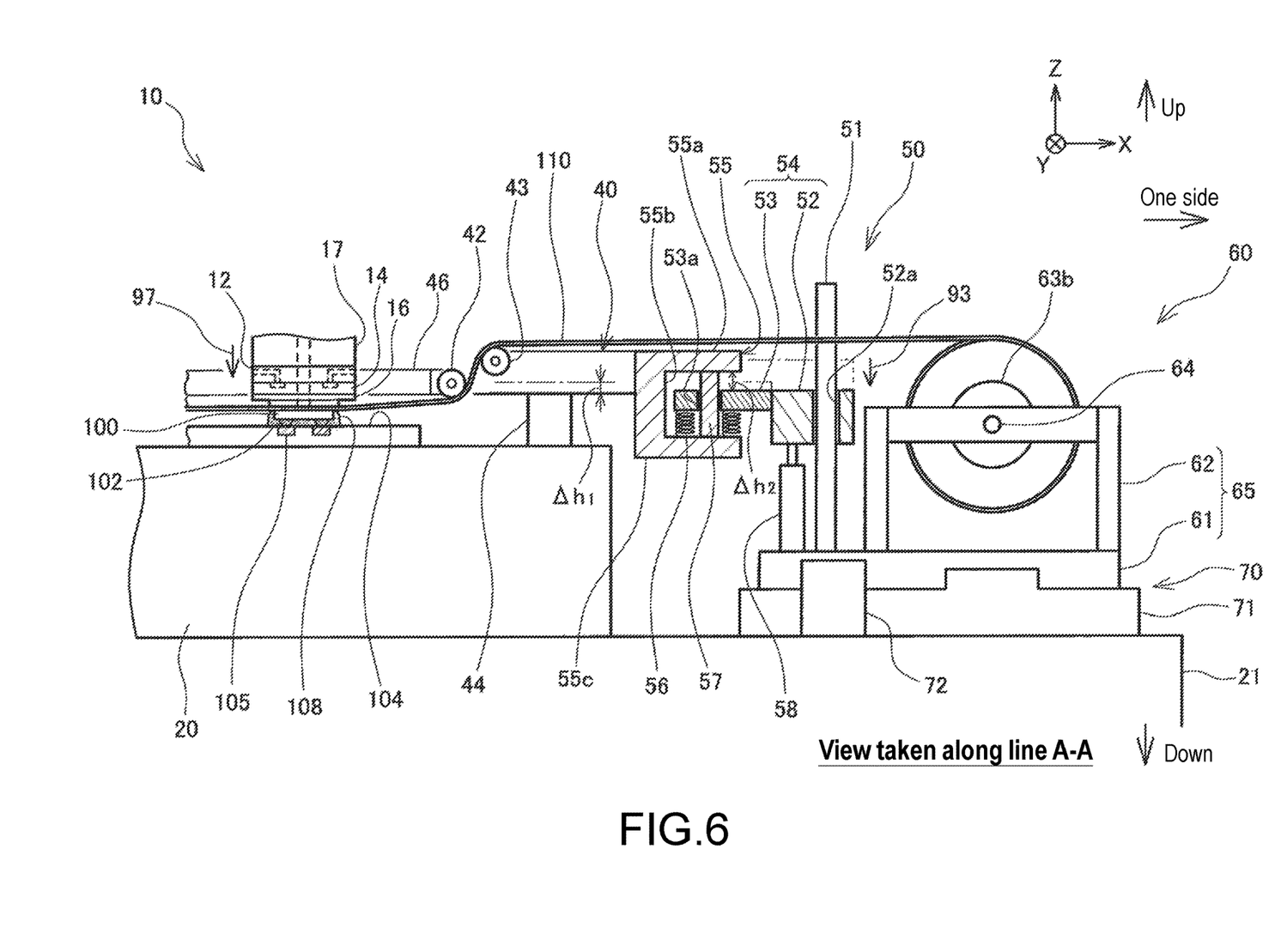
FIG. 6 is an elevational view showing a state in which a mounting head is lowered to mount the semiconductor chip on a substrate in the state shown in FIG. 5, and is a view taken along line AA shown in FIG. 2.

Next, as shown by an arrow 97 in FIG. 6, the control unit 80 lowers the mounting head 17 and presses the semiconductor chip 100 from the upper side of the cover film 110 with the projecting portion 16a of the pressing tool 16 at the tip. By pressing, the adhesive material 108 protrudes around the semiconductor chip 100, and a part of the adhesive material 108 crawls up the side surface of the semiconductor chip 100 and reaches the lower surface of the cover film 110. Further, by pressing, the bumps 102 formed on the semiconductor chip 100 come into contact with the electrodes 105 of the substrate 104. As described above, the parallelism between the cover film 110 and the upper surface of the bonding stage 20 is ensured, so the cover film 110 is in close contact with the upper surface of the semiconductor chip 100, and it is possible to prevent the adhesive material 108 extruded by the semiconductor chip 100 from crawling up unevenly and generating static electricity during mounting.

Then, the control unit 80 starts supplying electric power to the heater 14 and lifts the temperature of the pressing tool 16 by the heater 14. When the temperature of the pressing tool 16 rises, the semiconductor chip 100 is heated by the heat and the adhesive material 108 is softened. When the temperature is further lifted to exceed the melting temperature of the bumps 102, the bumps 102 of the semiconductor chip 100 melt. Then, when the temperature rises to the curing temperature of the adhesive material 108, the adhesive material 108 starts thermosetting.

After that, the control unit 80 starts the fan 19 shown in FIG. 1 and allows cooling air to flow through the air flow path 13 of the heat insulating block 12 to cool the pressing tool 16. As a result, the molten bumps 102 are cured, and the joining of the substrate 104 with the electrodes 105 is completed. Further, the temperature of the thermosetting adhesive material 108 also drops, and the mounting is completed in the state shown in FIG. 6. When the mounting is completed, the control unit 80 lifts the mounting head 17.

After lifting the mounting head 17, the control unit 80 lifts the slider 54 by the Z-direction actuator 58 of the lifting mechanism 50 at one side and another side. When the slider 54 is lifted by the height Ah2 shown in FIG. 6, the upper surface of the arm portion 53 of the slider 54 abuts the lower surface of the upper flange 55a of the connecting member 55. When the slider 54 is further lifted, the connecting member 55 and the film guide 40 are lifted as the slider 54 is lifted, and the cover film 110 is also lifted accordingly to return to the height shown in FIG. 3. When the cover film 110 is lifted to a height shown in FIG. 3, the control unit 80 retracts, by the moving mechanism 70, the cover film 110 to a position horizontally separated from the next mounting section 106 to which the semiconductor chip 100 to be temporarily crimped.

As described above, in the mounting apparatus 10 of the embodiment, the height of the film guide 40 at two sides can be adjusted by the lifting mechanism 50 each arranged at two sides of the bonding stage 20 to ensure the parallelism between the bonding stage 20 and the cover film 110, and the cover film 110 can be brought into close contact with the upper surface of the semiconductor chip 100. Therefore, when mounting the semiconductor chip 100, it is possible to prevent the adhesive material 108 extruded by the semiconductor chip 100 from crawling up unevenly and generating static electricity during mounting.

Further, in the mounting apparatus 10 of the embodiment, since the film guides 40 at two sides are connected by the linking member 46, the height difference of the film guides 40 at two sides can be eliminated, and the parallelism between the bonding stage 20 and the cover film 110 can be ensured. Further, since the mounting apparatus 10 of the embodiment presses the film guide 40 on the bonding stage 20 by the force of the springs 56, the height of the film guide 40 with respect to the surface of the bonding stage 20 can be made constant, and the parallelism between the bonding stage 20 and the cover film 110 can be ensured.

Next, a mounting apparatus 200 of another embodiment will be described with reference to FIG. 7. A film arranging mechanism 230 of the mounting apparatus 200 is configured by the film guide 40 and the lifting mechanism 50 that are provided at one side; the moving mechanisms 70; the film delivering mechanism 60 including the delivery roller 63a at another side and a winding roller 63b at one side; an another-side lifting mechanism 350 and an another-side film guide 340 that are provided at another side. The film delivering mechanism 60; the film guide 40 and the lifting mechanism 50 that are provided at one side; and the moving mechanisms 70 are configured the same as in the mounting apparatus 10 described above with reference to FIG. 1 to FIG. 6, therefore the description thereof will be omitted.

The another-side lifting mechanism 350 provided at another side does not include the Z-direction actuator 58, the slider 54, and the connecting member 55, and is configured by an another-side guide rail 351 only. The another-side guide rail 351 is mounted on the base 61 at another side and extends in the up-and-down direction to guide the another-side film guide 340 in the up-and-down direction. The another-side film guide 340 is connected to the film guide 40 at one side by the linking member 46, and moves in the up-and-down direction following the film guide 40 at one side. Further, the another-side film guide 340, similarly to the film guide 40 at one side, includes a base body portion 341, a lower guide roller 342, an upper guide roller 343, and a stopper 344. The base body portion 341 has the same structure as the film guide 40 at one side except that a hole for fitting into the another-side guide rail 351 is provided at the end at another side and that the length in the X direction is long; the lower guide roller 342, the upper guide roller 343, and the stopper 344 have the same structure as the lower guide roller 42, the upper guide roller 43, and the stopper 44 at one side, respectively.

Figure 7:
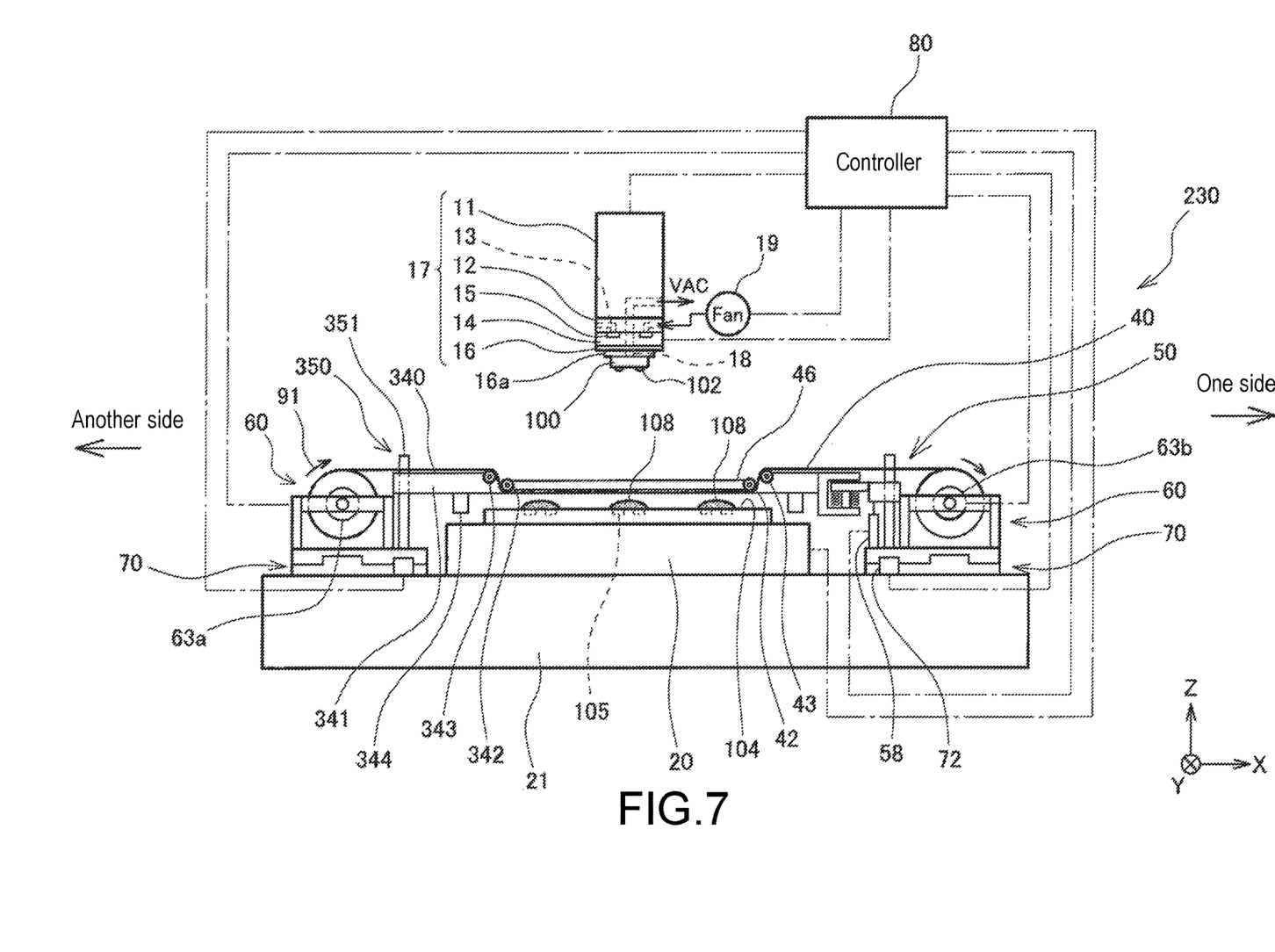
FIG. 7 is an elevational view showing the configuration of the mounting apparatus according to another embodiment.

The mounting apparatus 200 shown in FIG. 7 drives both the film guide 40 at one side and the another-side film guide 340 in the up-and-down direction by the Z-direction actuator 58 mounted on the lifting mechanism 50 at one side, therefore the structure can be simplified.

In the mounting apparatus 200, the height of the film guide 40 arranged at two sides of the bonding stage 20 can be adjusted to ensure the parallelism between the bonding stage 20 and the cover film 110.

The above describes the mounting apparatus 10 and the mounting apparatus 200 mounting the semiconductor chip 100 on the substrate 104, but the present invention is not limited thereto. The semiconductor chip 100 may be mounted on another semiconductor chip 100. In this case, the other semiconductor chip 100, similarly to the substrate 104, constitutes a mounted body.

What is claimed is:

1. A mounting apparatus pressing a semiconductor chip arranged on a mounted body, the mounting apparatus comprising:
    a bonding stage, holding the mounted body on which the semiconductor chip is arranged;
    a base stand, supporting the bonding stage;
    a mounting head, moving in a contacting/separating direction with respect to the mounted body and to which a pressing tool that presses the semiconductor chip on the mounted body is mounted on the tip; and
    a film arranging mechanism, provided on the base stand and moving a cover film along the bonding stage to arrange the cover film between the semiconductor chip and the pressing tool,
    wherein the film arranging mechanism comprises:
    film guides guiding the cover film, the film guide comprising a contact portion that contacts the bonding stage and defining a height of the cover film with respect to the bonding stage; and
    lifting mechanisms, connected to the film guides via elastic members and lifting and lowering the film guides with respect to the bonding stage, wherein the lifting mechanism comprises a guide rail, sharing a base with the film arrangement mechanism in order that the lifting mechanism is able to move in an up-and-down direction along the guide rail affecting the height of the cover film with respect to the bonding stage.

2. The mounting apparatus according to claim 1,
    wherein the film guides and the lifting mechanisms are each provided at two sides of the bonding stage with the bonding stage sandwiched in between.

3. The mounting apparatus according to claim 2,
    wherein the film arranging mechanism comprises a linking member linking between the film guides each provided at the two sides of the bonding stage with the bonding stage sandwiched in between.

4. The mounting apparatus according to claim 1,
    wherein the lifting mechanism further comprises:
    a slider, guided by the guide rail and moving in the up-and-down direction; and
    a connecting member in which one end is mounted on the slider via the elastic members so as to be relatively movable in the up-and-down direction by a predetermined vertical width and the film guide is mounted on another end,
    wherein the slider, when the contact portion of the film guide comes into contact with an upper surface of the bonding stage, presses the film guide on the upper surface of the bonding stage via the elastic members and the connecting member.

5. The mounting apparatus according to claim 4,
    wherein the film arranging mechanism comprises:

a film delivering mechanism, comprising a pair of rollers which are provided on the base stand at the two sides of the bonding stage with the bonding stage sandwiched in between and on which the cover film is hung, and sequentially delivering the new cover film, and wherein the film delivering mechanism comprises a base supporting each of the rollers, and the guide rail of the lifting mechanism is mounted on the base.

6. The mounting apparatus according to claim 2, wherein the film arranging mechanism comprises:

a one-side film guide and a one-side lifting mechanism, provided at one side of the bonding stage; and an another-side film guide and an another-side lifting mechanism, provided at another side of the bonding stage, and wherein the one-side lifting mechanism comprises:

the guide rail, provided on the base stand at one side and extending in an up-and-down direction;

a slider, guided by the guide rail and moving in the up-and-down direction; and a connecting member in which one end is mounted on the slider via the elastic members so as to be relatively movable in the up-and-down direction by a predetermined vertical width and the one-side film guide is mounted on another end, wherein the another-side lifting mechanism comprises:

an another-side guide rail, provided on the base stand at another side and extending in the up-and-down direction to guide the another-side film guide in the up-and-down direction, and wherein the film arranging mechanism comprises a linking member linking the one-side film guide and the another-side film guide, and the slider, when the contact portion of the one-side film guide and the contact portion of the another-side film guide come into contact with an upper surface of the bonding stage, presses the contact portion of the one-side film guide on the upper surface of the bonding stage via the elastic members and the connecting member and presses the contact portion of the another-side film guide on the upper surface of the bonding stage via the linking member.

7. The mounting apparatus according to claim 6, wherein the film arranging mechanism comprises:

a film delivering mechanism, comprising a pair of rollers which are provided on the base stand at two sides of the bonding stage with the bonding stage sandwiched in between and on which the cover film is hung, and sequentially delivering the new cover film, and wherein the film delivering mechanism comprises a base supporting each of the rollers, and the guide rail is mounted on the base at one side, and the another-side guide rail is mounted on the base at another side.

8. The mounting apparatus according to claim 4, wherein the connecting member is a groove-shaped cross-sectional member configured by an upper flange, a lower flange facing the upper flange, and a web connecting between the upper flange and the lower flange, the connecting member comprising:

a slider-guide, extending in the up-and-down direction between the upper flange and the lower flange, and wherein the slider is guided by the slider-guide so as to be movable with respect to the connecting member in the up-and-down direction between the upper flange and the lower flange, and the elastic members are provided between a lower end of the slider and an upper surface of the lower flange.

9. The mounting apparatus according to claim 5, wherein the film arranging mechanism comprises moving mechanisms moving the film delivering mechanism in a horizontal direction with respect to the bonding stage.

10. The mounting apparatus according to claim 2, wherein the lifting mechanism further comprises:

a slider, guided by the guide rail and moving in the up-and-down direction; and a connecting member in which one end is mounted on the slider via the elastic members so as to be relatively movable in the up-and-down direction by a predetermined vertical width and the film guide is mounted on another end, wherein the slider, when the contact portion of the film guide comes into contact with an upper surface of the bonding stage, presses the film guide on the upper surface of the bonding stage via the elastic members and the connecting member.

11. The mounting apparatus according to claim 3, wherein the lifting mechanism further comprises:

a slider, guided by the guide rail and moving in the up-and-down direction; and a connecting member in which one end is mounted on the slider via the elastic members so as to be relatively movable in the up-and-down direction by a predetermined vertical width and the film guide is mounted on another end, wherein the slider, when the contact portion of the film guide comes into contact with an upper surface of the bonding stage, presses the film guide on the upper surface of the bonding stage via the elastic members and the connecting member.

12. The mounting apparatus according to claim 5, wherein the connecting member is a groove-shaped cross-sectional member configured by an upper flange, a lower flange facing the upper flange, and a web connecting between the upper flange and the lower flange, the connecting member comprising:

a slider-guide, extending in the up-and-down direction between the upper flange and the lower flange, and wherein the slider is guided by the slider-guide so as to be movable with respect to the connecting member in the up-and-down direction between the upper flange and the lower flange, and the elastic members are provided between a lower end of the slider and an upper surface of the lower flange.

13. The mounting apparatus according to claim 6, wherein the connecting member is a groove-shaped cross-sectional member configured by an upper flange, a lower flange facing the upper flange, and a web connecting between the upper flange and the lower flange, the connecting member comprising:

a slider-guide, extending in the up-and-down direction between the upper flange and the lower flange, and wherein the slider is guided by the slider-guide so as to be movable with respect to the connecting member in the up-and-down direction between the upper flange and the lower flange, and the elastic members are provided between a lower end of the slider and an upper surface of the lower flange.

14. The mounting apparatus according to claim 7, wherein the connecting member is a groove-shaped cross-sectional member configured by an upper flange, a lower flange facing the upper flange, and a web connecting between the upper flange and the lower flange, the connecting member comprising:

a slider-guide, extending in the up-and-down direction between the upper flange and the lower flange, and wherein the slider is guided by the slider-guide so as to be movable with respect to the connecting member in the up-and-down direction between the upper flange and the lower flange, and the elastic members are provided between a lower end of the slider and an upper surface of the lower flange.

15. The mounting apparatus according to claim 7, wherein the film arranging mechanism comprises moving mechanisms moving the film delivering mechanism in a horizontal direction with respect to the bonding stage.

* * * * *